United States Patent
Mukherjee et al.

(10) Patent No.: US 10,963,612 B2
(45) Date of Patent: Mar. 30, 2021

(54) SCAN CELL ARCHITECTURE FOR IMPROVING TEST COVERAGE AND REDUCING TEST APPLICATION TIME

(71) Applicant: Mentor Graphics Corporation, Wilsonville, OR (US)

(72) Inventors: Nilanjan Mukherjee, Wilsonville, OR (US); Jedrzej Solecki, Wilsonville, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/845,139

(22) Filed: Apr. 10, 2020

(65) Prior Publication Data

US 2020/0327268 A1 Oct. 15, 2020

Related U.S. Application Data

(60) Provisional application No. 62/831,768, filed on Apr. 10, 2019.

(51) Int. Cl.
*G06F 30/333* (2020.01)
*G01R 31/3177* (2006.01)
*G01R 31/28* (2006.01)
*G01R 31/317* (2006.01)

(52) U.S. Cl.
CPC ....... *G06F 30/333* (2020.01); *G01R 31/3177* (2013.01); *G01R 31/2843* (2013.01); *G01R 31/31704* (2013.01)

(58) Field of Classification Search
CPC ............ G01R 31/2843; G01R 31/3177; G01R 31/31704; G06F 30/333
See application file for complete search history.

(56) References Cited

U.S. PATENT DOCUMENTS

| | | | |
|---|---|---|---|
| 7,818,644 B2 * | 10/2010 | Rajski | G01R 31/3177 714/732 |
| 9,003,248 B2 | 4/2015 | Rajski et al. | |
| 9,009,553 B2 | 4/2015 | Rajski et al. | |
| 9,347,993 B2 | 5/2016 | Rajski et al. | |
| 9,714,981 B2 | 7/2017 | Rajski et al. | |
| 10,379,161 B2 | 8/2019 | Rajski et al. | |

(Continued)

OTHER PUBLICATIONS

Senling Wang et al, "Automotive Functional Safety Assurance by POST with Sequential Observation", IEEE Design & Test, vol. 35, Issue: 3, Jun. 2018, pp. 39-45.

*Primary Examiner* — Stacy Whitmore

(57) ABSTRACT

A scan cell comprises: a state element and selection and combination circuitry. The selection and combination circuitry comprises first combination circuitry configured to combine a signal from a scan input of the scan cell with a signal from a functional circuit input of the scan cell to generate a first signal, second combination circuitry configured to combine the signal from the functional circuit input of the scan cell with an output signal of the state element to generate a second signal, and selection circuitry configured to select an input signal for the state element from the signal from the scan input of the scan cell, the signal from the functional circuit input of the scan cell, the first signal, and the second signal based on two selection input signals of the scan cell.

14 Claims, 6 Drawing Sheets

(56) References Cited

U.S. PATENT DOCUMENTS

| | | | |
|---|---|---|---|
| 2012/0239993 A1* | 9/2012 | Chung | G01R 31/318547 |
| | | | 714/727 |
| 2013/0275824 A1* | 10/2013 | Tekumalla | G11C 29/32 |
| | | | 714/726 |
| 2014/0101501 A1* | 4/2014 | Devta Prasanna | |
| | | | G01R 31/31854 |
| | | | 714/727 |
| 2014/0372819 A1 | 12/2014 | Rajski et al. | |
| 2014/0372820 A1 | 12/2014 | Rajski et al. | |
| 2014/0372821 A1 | 12/2014 | Rajski et al. | |
| 2014/0372824 A1 | 12/2014 | Rajski et al. | |
| 2015/0212150 A1* | 7/2015 | Mittal | G01R 31/31855 |
| | | | 714/727 |
| 2016/0252573 A1 | 9/2016 | Rajski et al. | |
| 2018/0252768 A1* | 9/2018 | Rajski | G01R 31/31724 |
| 2018/0307553 A1* | 10/2018 | Acharya | G06F 11/0757 |

\* cited by examiner

| Modes | M1 (=SE) | M2 | D | SI | Q |
|---|---|---|---|---|---|
| Shift | 1 | 0 | d | s | s |
| Shift-observation | 1 | 1 | d | s | $d \oplus s$ |
| Capture | 0 | 0 | d | s | d |
| Capture-Accumulation | 0 | 1 | d | s | $d \oplus Q$ |

FIG. 4

SCAN CELL ARCHITECTURE FOR IMPROVING TEST COVERAGE AND REDUCING TEST APPLICATION TIME

RELATED APPLICATIONS

This application claims the benefit of U.S. Provisional Patent Application No. 62/831,768, filed on Apr. 10, 2019, and naming Nilanjan Mukherjee et al. as inventors, which application is incorporated entirely herein by reference.

FIELD OF THE DISCLOSED TECHNOLOGY

The presently disclosed technology relates to the field of circuit testing. Various implementations of the disclosed technology may be particularly useful for improving test coverage and reducing test application time.

BACKGROUND OF THE DISCLOSED TECHNOLOGY

Since its advent nearly five decades ago, scan has become one of the most influential and industry-proven structured design for test (DFT) technology. It allows a direct access to memory elements of a circuit under test (CUT) by reusing them to form shift registers in a test mode. An automatic test equipment (ATE) or another source of test patterns feeds serial inputs of the scan chains, and then the same ATE or a test response compactor captures test responses that leave the scan chains through their serial outputs. As all scan cells are typically controlled by a single scan enable signal, scan chains remain functionally indistinguishable, i.e., they all either shift data in and out or capture test responses. The resultant high controllability and observability of internal nodes made it possible to automatically generate high quality test patterns and to debug the discovered defects. Moreover, simple architecture of scan chains enables their automated stitching and insertion supported by electronic design automation (EDA) tools.

With the scan-based test paradigm firmly in place, several more advanced DFT technologies have been proposed. Noticeably, many logic built-in self-test (LBIST) schemes employ scan as their operational baseline to achieve high quality test using a limited volume of test data. Usually, these solutions comprise a pseudorandom test pattern generator (PRPG) feeding scan chains and a multiple-input signature register (MISR) compacting shifted-out responses. The same rules apply to test data compression where PRPG is typically re-placed with an on-chip test data decompressor.

Drawbacks of scan-based testing are mainly related to the fact that all scan chains are filled with a test pattern before it is applied. As a result, the vast majority of test time is spent on shifting test data. Consider a design with 100-cell long scan chains. Applying 10,000 double-capture test patterns will require 1,000,000 shift cycles and 20,000 capture cycles. Thus, as low as 2% of cycles are actually spent on testing: applying test stimuli and capturing test responses. In terms of test time, the result would be even worse, as the scan shift frequency is usually much lower than that in a capture (functional) mode. In logic BIST, the test time efficiency could be even lower. A typical scan shift frequency is on the order of 10 s of MHz whereas a functional clock frequency can be up to several GHz. Hence, 99.99% of test time can be spent on scan shifting.

Electronics content in vehicles is constantly growing, which enables advanced safety features, new information and entertainment services, and greater energy efficiency. Integrated circuits for the automotive electronics market must adhere to stringent requirements for quality and reliability, which are largely driven by safety standards such as ISO 26262 and Automotive Safety Integrity Level (ASIL) targets. ISO 26262 compliance requires the adoption of more advanced test solutions. In particular, for an integrated circuit to achieve necessary levels of reliability, LBIST capabilities should respond to challenges posed by automotive parts and to support a number of in-field test requirements including an ability to run periodic tests during functional operations. These periodic tests should be performed in short time periods due to strict limits on the length of power-up or idle times. It is thus advantageous to develop test techniques that can shorten test application time without adversely impacting fault coverage.

BRIEF SUMMARY OF THE DISCLOSED TECHNOLOGY

Various aspects of the disclosed technology relate to scan cells capable of operating in additional modes. In one aspect, there is a scan cell, comprising: a state element; and selection and combination circuitry comprising: first combination circuitry configured to combine a signal from a scan input of the scan cell with a signal from a functional circuit input of the scan cell to generate a first signal, second combination circuitry configured to combine the signal from the functional circuit input of the scan cell with an output signal of the state element to generate a second signal, and selection circuitry configured to select an input signal for the state element from the signal from the scan input of the scan cell, the signal from the functional circuit input of the scan cell, the first signal, and the second signal based on two selection input signals of the scan cell.

Each of the first combination circuitry and the second combination circuitry may comprise an XOR gate. The state element may be a flip-flop.

The selection circuitry may comprise a 4-to-1 multiplexer. Alternatively, the selection circuitry may comprise two AND gates and a 2-to-1 multiplexer.

A plurality of instances of the above scan cell form an observation scan chain in a circuit design. The plurality of instances may operate in a shift-observation mode during scan shifting and in a capture-accumulation mode during scan capturing.

In another aspect, there are one or more non-transitory computer-readable media storing computer-executable instructions for causing a computer or networked computers to replacing some or all of state elements in a circuit design with instances of the above scan cell.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose technology. Thus, for example, those skilled in the art will recognize that the disclose technology may be embodied or carried out in a manner that achieves or optimizes one advantage or group of advantages

BRIEF DESCRIPTION OF THE DRAWINGS

FIG. 4 illustrates a table summarizing the four operation modes of the scan cell shown in FIG. 3.

DETAILED DESCRIPTION OF THE DISCLOSED TECHNOLOGY

General Considerations

Figure 1:
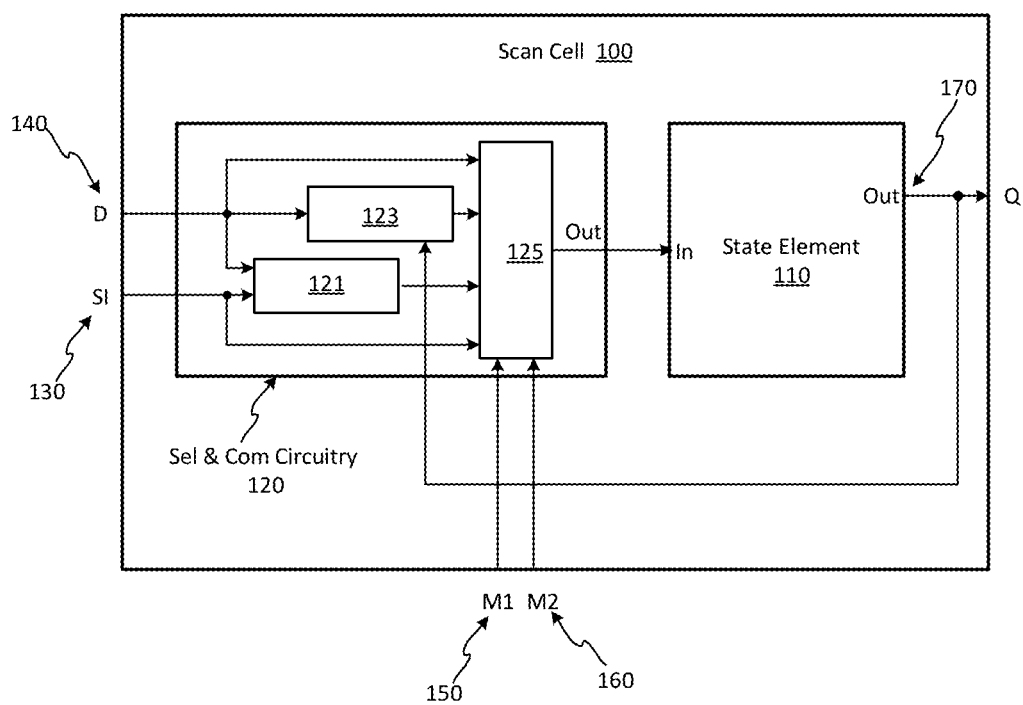
FIG. 1 illustrates an example of a block diagram of a scan cell that may be implemented according to various embodiments of the disclosed technology.

Various aspects of the disclosed technology relate to scan cells capable of operating in additional modes. In the following description, numerous details are set forth for the purpose of explanation. However, one of ordinary skill in the art will realize that the disclosed technology may be practiced without the use of these specific details. In other instances, well-known features have not been described in detail to avoid obscuring the presently disclosed technology.

The detailed description of a method or a device sometimes uses terms like "combine," "generate," and "select" to describe the disclosed method or the device function/structure. Such terms are high-level abstractions. The actual operations or functions/structures that correspond to these terms will vary depending on the particular implementation and are readily discernible by one of ordinary skill in the art.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Design for Test, Scan-Based Test, Test Compression, Logic BIST and Test Points

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an imperfection caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, of which all are hereby incorporated herein by reference.

Logic built-in self-test (Logic BIST) is a DFT technique that permits a circuit to test itself using embedded test logic without the need of an external tester. Classical Logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-pattern pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

Test points can also be used to increase the fault coverage for logic BIST by improving the probability of detecting random-resistant faults. Test point insertion (TPI) algorithms select hard-to-control and hard-to-observe sites to insert control and observation points. When active, a control point forces a circuit's node to a specific logic value, whereas an observation point acts as a pseudo-primary output. To identify the most effective test points while minimizing their total number and a possible impact on a design performance, numerous approximate techniques have been proposed. These TPI algorithms may be guided by exact fault simulation, approximate testability measures, cost functions, gradient-based metrics, or signal correlation.

Test points can be used to decrease deterministic pattern counts as well. For example, a test point insertion algorithm can aim at identifying and resolving conflicts between ATPG-assigned internal signals through insertion of conflict-aware test points to increase the number of faults detected by a single pattern. A hybrid test point insertion method is recently developed to simultaneously reduce deterministic test pattern counts and increase detectability of random-resistant faults by resolving cases where demands of internal nets for a given logic value come up against very low likelihood of getting this value with pseudorandom tests. Details concerning the hybrid test point insertion method can be found in E. Moghaddam et al., "Test point insertion in hybrid test compression/LBIST architectures," 2016 IEEE International Test Conference (ITC), paper 2.1.

All of the above mentioned processes, design insertion for testing, test pattern generation, test compression, and test point insertion, are normally performed by various electronic design automation tools such as those in the Tessent family of software tools available from Mentor Graphics Corporation, Wilsonville, Oreg.

Scan Cell Architecture and Applications

FIG. 1 illustrates an example of a block diagram of a scan cell 100 that may be implemented according to various embodiments of the disclosed technology. The scan cell 100 comprises a state element 110 and selection and combination circuitry 120. The state element 110 can be a flip-flop. The selection and combination circuitry 120 comprises first combination circuitry 121, second combination circuitry 123, and selection circuitry 125. The first combination circuitry 121 is configured to combine a signal from a scan input (SI) 130 of the scan cell 100 with a signal from a functional circuit input (D) 140 of the scan cell 100 to generate a first signal. The second combination circuitry 123 is configured to combine the signal from the functional circuit input (D) 140 of the scan cell 100 with an output signal 170 of the state element 110 to generate a second signal. The selection circuitry 125 is configured to select an input signal for the state element 110 from the four signals: the signal from the scan input (SI) 130 of the scan cell 100, the signal from the functional circuit input (D) 140 of the scan cell 100, the first signal, and the second signal. The selection is based on two selection input signals M1 (150) and M2 (160) of the scan cell 100.

When the signal from the scan input (SI) 130 of the scan cell 100 is selected, the scan cell 100 operates in the conventional scan shift mode; when the signal from the functional circuit input (D) 140 of the scan cell 100 is selected, the scan cell 100 operates in the conventional scan capture mode during a test or in a circuit functional mode; when the first signal is selected, the scan cell 100 accumulates the circuit test responses during a scan shift mode, which is referred to as operating in a shift-observation mode; and when the second signal is selected, the scan cell 100 accumulates the circuit test responses during a scan capture mode, which is referred to as operating in a capture-accumulation mode.

Figure 2:
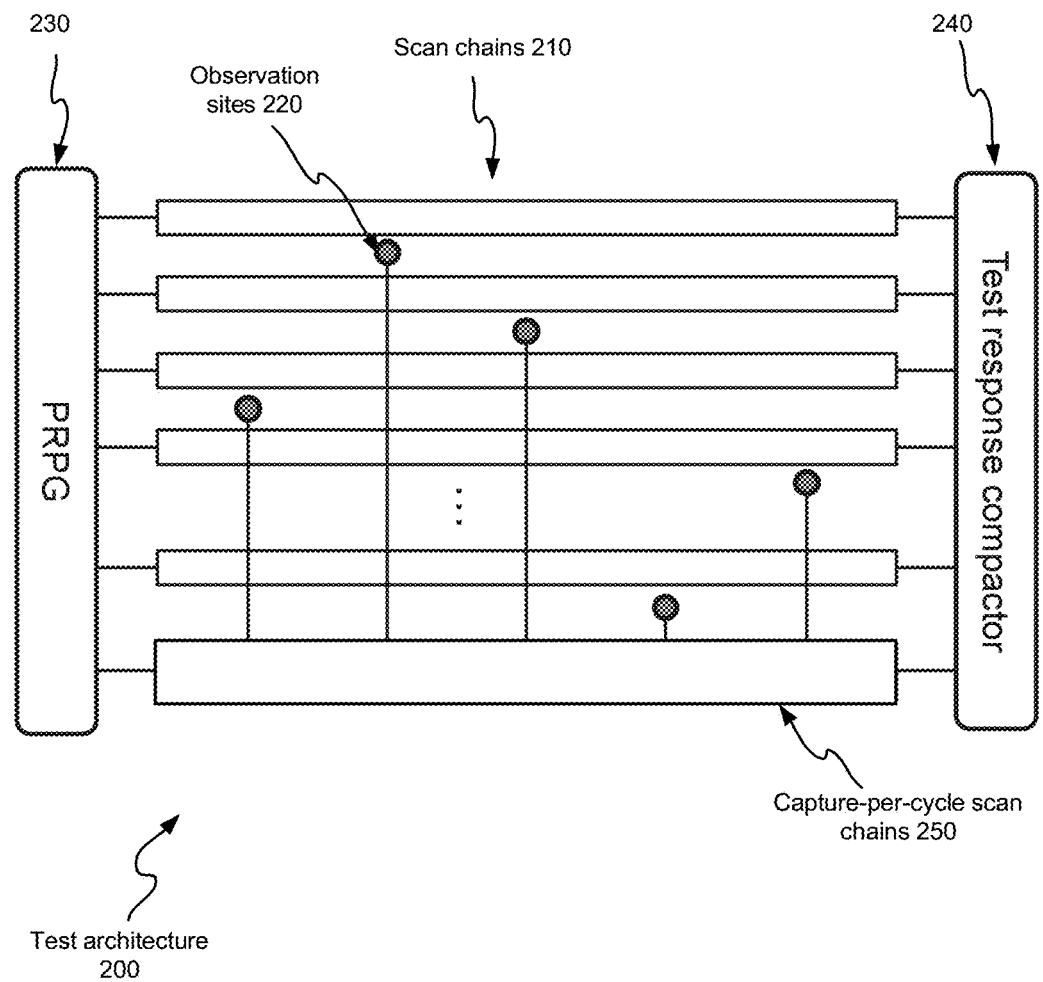
FIG. 2 illustrates an example of a test architecture in which one or more of the scan chains formed with instances the scan cell shown in FIG. 1 according to various embodiments of the disclosed technology.

FIG. 2 illustrates an example of a test architecture in which one or more of the scan chains formed with instances the scan cell shown in FIG. 1 according to various embodiments of the disclosed technology. The test architecture 200 comprises scan chains 210. The scan chains 210 comprise a plurality of regular scan chains for shifting in test stimuli and capturing and shifting out test responses generated by the circuit under test and a capture-per-cycle scan chain 250. A regular scan chain can be formed by instances of a conventional scan cell or instances of a scan cell according to various embodiments of the disclosed technology such as the scan cell 100. The capture-per-cycle scan chain 250 can be formed by instances of a scan cell according to various embodiments of the disclosed technology. The outputs of the scan cells on the capture-per-cycle scan chain 250 do not drive any logic of the circuit under test in the test mode. The D inputs of these scan cells are typically coupled to observation sites (observation points) 220. It should be noted that while only one capture-per-cycle scan chain is shown in the figure, the test architecture according to various embodiments of the disclosed technology can have multiple capture-per-cycle scan chains.

The test architecture 200 also comprises a pseudo-random pattern generator (PRPG) 230 and a test response compactor 240. The pseudo-random pattern generator may be a linear feedback shift register (LFSR) or a cellular automaton (CA), and the test response compactor may be implemented by a multiple-input signature register (MISR). It should be noted that a test architecture according to various embodiments of the disclosed technology can use another test stimuli source such as a decompressor for deterministic testing or a hybrid device to replace the pseudo-random pattern generator 230. It should also be noted that an on-chip test stimuli source is not required to practice the disclosed technology.

The following is an example of the test architecture 200 operating during a test according to various embodiments of the disclosed technology: Initially, while a pseudorandom test pattern is shifted in, the regular scan chains operate in the scan shift mode and the one or more capture-per-cycle scan chain operate in the shift-observation mode. During the scan shifting operation, the changing content of the scan cells on the regular scan chains becomes stimuli feeding the circuit every clock cycle. It allows the one or more capture-per-cycle scan chains to capture and to accumulate test responses every clock cycle. Next, the regular scan chains switch to the scan capture mode to capture test responses and the one or more capture-per-cycle scan chains switch to the capture-accumulation mode. The capture-accumulation mode allows the one or more capture-per-cycle scan chains to capture new test responses while preserving information of the test responses previously captured but not yet shifted-out. Next, the regular scan chains return to the shift mode and the one or more capture-per-cycle scan chains return to the shift-observation mode. While the captured (and accumulated) test responses are shifting out, a new test pattern is shifted in. During the shift out process, a single bit of the resultant response enters a test response compactor (e.g., a MISR) each clock cycle. As a result, the circuit can be tested in accordance with the test-per-clock paradigm using the one or more capture-per-cycle scan chains, while preserving benefits of the conventional test-per-shift approach using the regular scan chains. It should be noted that the capture-accumulation mode of a scan cell according to various embodiments of the disclosed technology can be employed not only for test-per-clock applications but also for multiple capture applications. It should also be noted that a scan cell can operate only in the shift-observation mode but not in a combination with the capture-accumulation mode or in a combination with the other mode(s) during a test.

Suitable test point locations such as the observation points coupled to the one or more capture-per-cycle scan chains may be determined by searching for internal lines that have low observability, but are preferable propagation paths for a significant number of faults. Moreover, control points may be selected by also considering whether they can improve fault propagation towards test-per-clock-driven observation points, and thus increase their detection probability.

Experimental results show that various implementations of the disclose technology can significantly reduce test application time (or to apply much larger number of vectors within the same time interval) by having pseudorandom test patterns delivered in a test-per-clock fashion and by recording test results by means of per-cycle-driven observation test points. In particular, orders of magnitude more test patterns (depending on the scan size) can be applied during the time of a conventional scan-based logic BIST session.

The disclosed technology is well positioned to achieve a better coverage of un-modeled defects. With various implementations of the disclosed technology, observation test points can be used to monitor the most sensitive fault propagation paths.

The disclosed technology may also help in improving quality of fault diagnosis, as the compaction scan chains may not be allowed to propagate the erroneous responses back to the circuit. Thus, the existing partial-scan-based diagnostic techniques turn out to be applicable.

Figure 3:
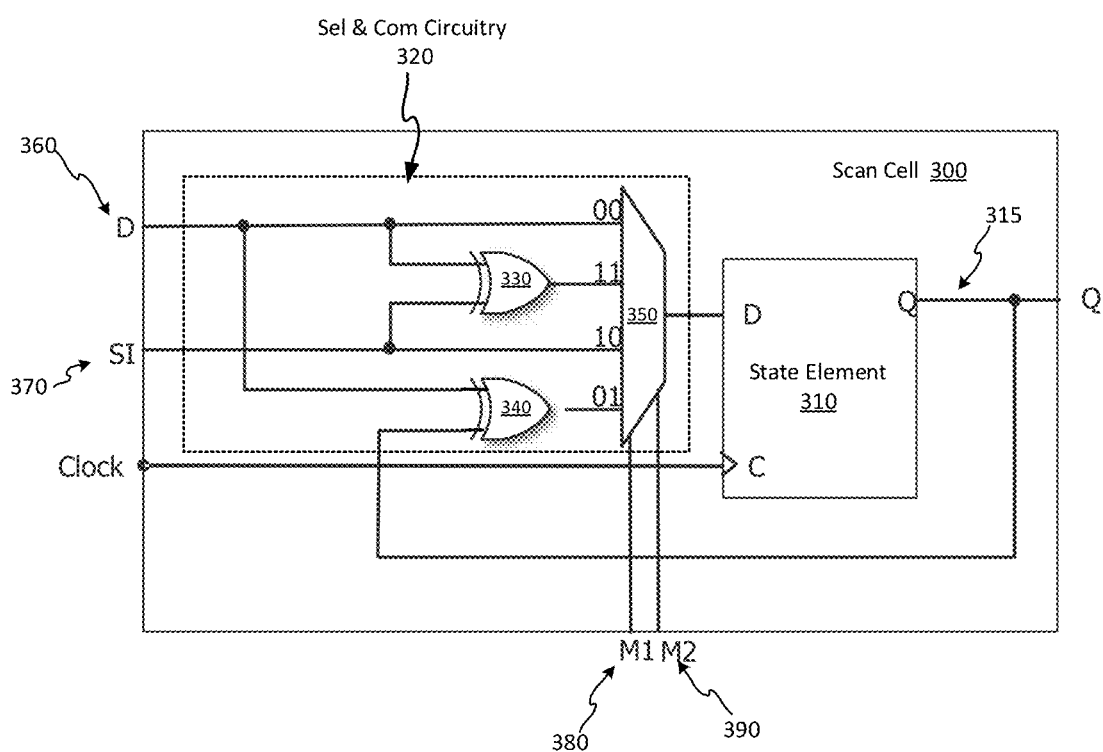
FIG. 3 illustrates another example of a block diagram of a scan cell that may be implemented according to various embodiments of the disclosed technology.

FIG. 3 illustrates another example of a block diagram of a scan cell 300 that may be implemented according to various embodiments of the disclosed technology. Like the scan cell 100, the scan cell 300 comprises a state element 310 and selection and combination circuitry 320. The state element 310 can be a flip-flop. The selection and combination circuitry 320 comprises two logic XOR gates 330 and 340 functioning as the first combination circuitry 121 and the second combination circuitry 123 shown in FIG. 1, respectively. The XOR gate 330 combines a signal from a scan input (SI) 370 of the scan cell 300 with a signal from a functional circuit input (D) 360 of the scan cell 300 to generate a first signal. The XOR gate 340 combines the signal from the functional circuit input (D) 360 of the scan cell 300 with an output signal (Q) 315 of the state element 310 to generate a second signal. The selection and combination circuitry 320 further comprises a four-to-one multiplexer 350 functioning as the selection circuitry 125 shown in FIG. 1. The four-to-one multiplexer 350 selects an input signal for the state element 310 from the signal from the scan input (SI) 370 of the scan cell 300, the signal from the functional circuit input (D) 360 of the scan cell 300, the first signal, and the second signal based on two selection input signals M1 (380) and M2 (390) of the scan cell 300.

FIG. 4 illustrates a table summarizing the four operation modes of the scan cell 300. When M1(380)=1 and M2(390) =0, the scan cell 300 operates in the conventional shift mode: data bits are shifted into and out of the scan cell 300 through the scan input (SI) 370. When M1(380)=0 and M2(390)=0, the scan cell 300 operates in the conventional capture mode: a signal at the functional circuit input (D) 360 is captured by the scan cell 300. When M1(380)=1 and M2(390)=1, the scan cell 300 operates in the shift-observation mode: data bits from the scan input (SI) 370 and the functional circuit input (D) 360, respectively are combined by the XOR gate 330 and captured by the state element 310. When M1(380)=0 and M2(390)=1, the scan cell 300 operates in the capture-accumulation mode: a data bit at the functional circuit input (D) 360 is combined with the bit stored in the state element 310 by the XOR gate 340 and then captured by the state element 310.

Figure 5:
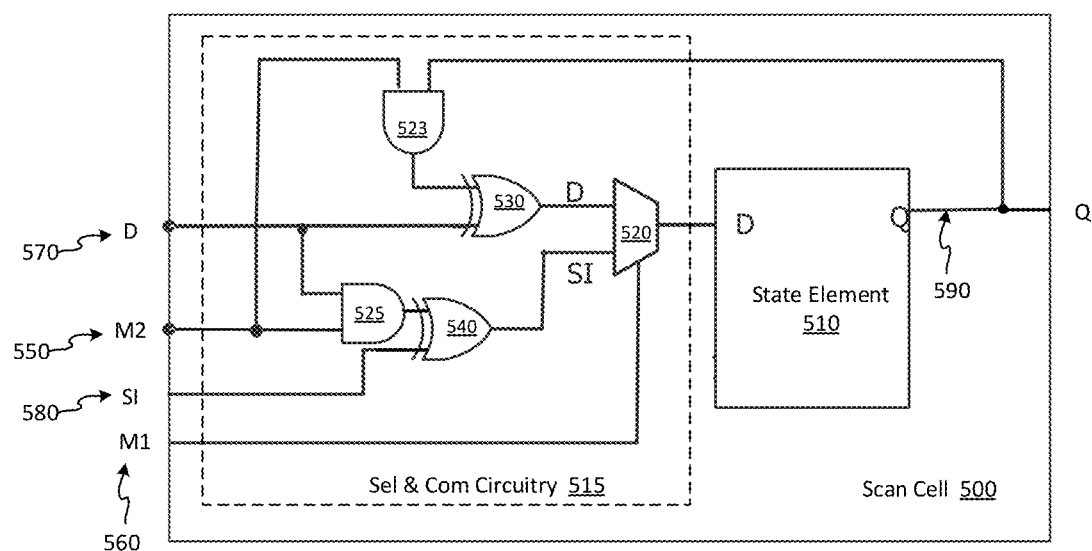
FIG. 5 illustrates still another example of a block diagram of a scan cell that may be implemented according to various embodiments of the disclosed technology.

FIG. 5 illustrates still another example of a block diagram of a scan cell 500 that may be implemented according to various embodiments of the disclosed technology. Like the scan cells 100 and 300, the scan cell 500 comprises a state element 510 and selection and combination circuitry 515. Like the scan cell 300, the selection and combination circuitry 515 comprises two logic XOR gates 540 and 530 functioning as the first combination circuitry 121 and the second combination circuitry 123 shown in FIG. 1, respectively. Unlike the selection and combination circuitry 320 using the single four-to-one multiplexer 350 to perform the selection function, however, the selection and combination circuitry 515 further comprises two AND gates 523 and 525 and a two-to-one multiplexer 520 which serve as the selection circuitry 125 shown in FIG. 1.

For scan cell 500, when M2(550)=0, outputs of both the AND gates 523 and 525 are zero. As such, outputs of the XOR gates 540 and 530 will follow signals from a scan input (SI) 580 and a functional circuit input (D) 570, respectively, and the signal at M1(560) will determine whether the signal at the scan input (SI) 580 or the signal at the functional circuit input (D) 570 drives the state element 510. These two operation modes correspond to the conventional shift mode and the conventional capture mode, respectively. When M2(550)=1, outputs of the AND gates 523 and 525 are the signal from an output (Q) of the state element 510 and the signal from the functional circuit input (D) 570, respectively. The XOR gates 540 and 530 thus combine the signal from the functional circuit input (D) 570 with the signal from the scan input (SI) 580 and the signal from the output of the state element 510, respectively. The signal at M1(560) can determine whether the former combined signal or the latter combined signal drives the state element 510, which correspond to the shift-observation mode and the capture-accumulation mode, respectively. Accordingly, the table in FIG. 4 is applicable to the scan cell 500 as well.

Illustrative Computing Environment

Figure 6:
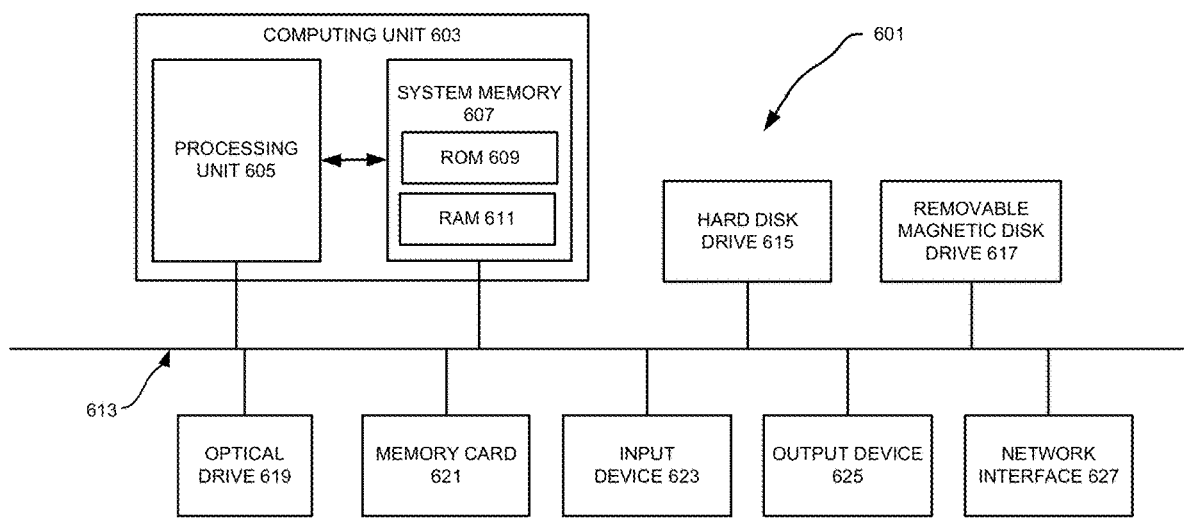
FIG. 6 illustrates a programmable computer system with which various embodiments of the disclosed technology may be employed.

Some embodiments of the disclosed technology related to inserting test circuitry into a design may be implemented through the execution of software instructions by a computing device, such as a programmable computer. FIG. 6 shows an illustrative example of such a programmable computer (a computing device 601). As seen in this figure, the computing device 601 includes a computing unit 603 with a processing unit 605 and a system memory 607. The processing unit 605 may be any type of programmable electronic device for executing software instructions, but will conventionally be a microprocessor. The system memory 607 may include both a read-only memory (ROM) 609 and a random access memory (RAM) 611. As will be appreciated by those of ordinary skill in the art, both the read-only memory (ROM) 609 and the random access memory (RAM) 611 may store software instructions for execution by the processing unit 605.

The processing unit 605 and the system memory 607 are connected, either directly or indirectly, through a bus 613 or alternate communication structure, to one or more peripheral devices. For example, the processing unit 605 or the system memory 607 may be directly or indirectly connected to one or more additional memory storage devices, such as a "hard" magnetic disk drive 615, a removable magnetic disk drive 617, an optical disk drive 619, or a flash memory card 621. The processing unit 605 and the system memory 607 also may be directly or indirectly connected to one or more input devices 623 and one or more output devices 625. The input devices 623 may include, for example, a keyboard, a pointing device (such as a mouse, touchpad, stylus, trackball, or joystick), a scanner, a camera, and a microphone. The output devices 625 may include, for example, a monitor display, a printer and speakers. With various examples of the computer 601, one or more of the peripheral devices 615-625 may be internally housed with the computing unit 603. Alternately, one or more of the peripheral devices 615-625 may be external to the housing for the computing unit 603 and connected to the bus 613 through, for example, a Universal Serial Bus (USB) connection.

With some implementations, the computing unit 603 may be directly or indirectly connected to one or more network interfaces 627 for communicating with other devices making up a network. The network interface 627 translates data and control signals from the computing unit 603 into network messages according to one or more communication protocols, such as the transmission control protocol (TCP) and the Internet protocol (IP).

Also, the interface 627 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 601 is illustrated as an example only, and it not intended to be limiting. Various embodiments of the disclosed technology may be implemented using one or more computing devices that include the components of the computer 601 illustrated in FIG. 6, which include only a subset of the components illustrated in FIG. 6, or which include an alternate combination of components, including components that are not shown in FIG. 6. For example, various embodiments of the disclosed technology may be implemented using a multiprocessor computer, a plurality of single and/or multiprocessor computers arranged into a network, or some combination of both.

CONCLUSION

While the disclosed technology has been described with respect to specific examples including presently preferred modes of carrying out the disclosed technology, those skilled in the art will appreciate that there are numerous variations and permutations of the above described systems and technology that fall within the spirit and scope of the disclosed technology as set forth in the appended claims. For example, while two examples of the selection and combination circuitry in the scan cell have been employed to describe the disclosed technology (FIGS. 3 and 5), it should be appreciated that various examples of the disclosed technology may be implemented using the selection and combination circuitry having a topology different from those shown in FIGS. 3 and 5.

What is claimed is:

1. A scan cell, comprising:
   a state element; and
   selection and combination circuitry comprising:
      first combination circuitry configured to combine a signal from a scan input of the scan cell with a signal from a functional circuit input of the scan cell to generate a first signal,
      second combination circuitry configured to combine the signal from the functional circuit input of the scan cell with an output signal of the state element to generate a second signal, and
      selection circuitry configured to select an input signal for the state element from the signal from the scan input of the scan cell, the signal from the functional circuit input of the scan cell, the first signal, and the second signal based on two selection input signals of the scan cell.

2. The scan cell recited in claim 1, wherein each of the first combination circuitry and the second combination circuitry comprises an XOR gate.

3. The scan cell recited in claim 1, wherein the state element is a flip-flop.

4. The scan cell recited in claim 1, wherein the selection circuitry comprises a 4-to-1 multiplexer.

5. The scan cell recited in claim 1, wherein the selection circuitry comprises a 2-to-1 multiplexer and two AND gates.

6. The scan cell recited in claim 1, of which a plurality of instances form an observation scan chain in a circuit design.

7. The scan cell recited in claim 6, wherein the plurality of instances operate in a shift-observation mode during scan shifting and in a capture-accumulation mode during scan capturing.

8. One or more computer-readable media storing computer-executable instructions for causing a computer to replace some or all of state elements in a circuit design with instances of a scan cell, the scan cell comprising:
   a state element; and
   selection and combination circuitry comprising:
      first combination circuitry configured to combine a signal from a scan input of the scan cell with a signal from a functional circuit input of the scan cell to generate a first signal,
      second combination circuitry configured to combine the signal from the functional circuit input of the scan cell with an output signal of the state element to generate a second signal, and
      selection circuitry configured to select an input signal for the state element from the signal from the scan input of the scan cell, the signal from the functional circuit input of the scan cell, the first signal, and the second signal based on two selection input signals of the scan cell.

9. The one or more computer-readable media recited in claim 8, wherein each of the first combination circuitry and the second combination circuitry comprises an XOR gate.

10. The one or more computer-readable media recited in claim 8, wherein the state element is a flip-flop.

11. The one or more computer-readable media recited in claim 8, wherein the selection circuitry comprises a 4-to-1 multiplexer.

12. The one or more computer-readable media recited in claim 8, wherein the selection circuitry comprises a 2-to-1 multiplexer and two AND gates.

13. The one or more computer-readable media recited in claim 8, of which a plurality of instances form an observation scan chain in a circuit design.

14. The one or more computer-readable media recited in claim 13, wherein the plurality of instances operate in a shift-observation mode during scan shifting and in a capture-accumulation mode during scan capturing.

* * * * *